United States Patent [19]
Takenaka

[11] Patent Number: 6,072,618
[45] Date of Patent: Jun. 6, 2000

[54] LIGHT TRANSMITTING APPARATUS INCORPORATING EMISSION SPECTRUM CONTROL FUNCTION

[75] Inventor: Hiroshi Takenaka, Tokyo, Japan

[73] Assignee: NEC Corporation, Tokyo, Japan

[21] Appl. No.: 09/106,757

[22] Filed: Jun. 30, 1998

[30]     Foreign Application Priority Data

Aug. 13, 1997  [JP]  Japan ..................................... 9-218786

[51] Int. Cl.[7] ............................. H01S 3/10; H04B 10/04; H04B 10/12; G02F 1/35
[52] U.S. Cl. ......................... 359/239; 359/187; 359/188; 372/38
[58] Field of Search .................................... 359/180, 187, 359/182, 188, 239; 372/33, 32, 31, 38, 29

[56]            References Cited

U.S. PATENT DOCUMENTS 5,715,265  9/1996  Epworth ................................... 372/38

FOREIGN PATENT DOCUMENTS 7-28107  1/1995  Japan .
8-6078   1/1996  Japan .

Primary Examiner—Georgia Epps
Assistant Examiner—Margaret Burke
Attorney, Agent, or Firm—McGinn & Gibb, P.C.

[57]            ABSTRACT

A light transmitting apparatus is constructed such that a transmission data signal Sa is transmitted to a light emitting element 21 via a driving circuit 23 and a modulation circuit 24 of a control circuit 22. Signal light outputted therefrom is transmitted to a light transmission path via an optical fiber 27, an optical circulator 25 and an optical fiber 25. Stokes light (backward scattered light) produced due to stimulated Brollouin scattering is inputted to a photo detector 26 via a port P3 from a port P2 of the optical circulator 25. A detection signal Sb assuming a level corresponding to this light intensity is outputted to a modulation circuit 24 of the control circuit 22. When the level of the detection signal from the photo detector 26 increases, modulation on a driving current to the light emitting element 21 is effected so that an emission spectral width of the light emitting element 21 is enlarged, thus enlarging the emission spectral width of the light emitting element 21. As a result, a threshold value at which stimulated Brillouin scattering occurs is set high, and a quantity of generation of stokes light can be reduced. With a simple construction, the backward scattered light produced due to the stimulated Brillouin scattering can be surely suppressed, whereby a quality of data transmission is enhanced and long-distance optical communications can be carried out.

20 Claims, 5 Drawing Sheets

LIGHT TRANSMITTING APPARATUS INCORPORATING EMISSION SPECTRUM CONTROL FUNCTION

BACKGROUND OF THE INVENTION

1. Field of the Invention

The present invention relates to a light transmitting apparatus constructed to suppress backward scattered light (stokes light) caused due to stimulated Brillouin scattering (SBS) which occurs on a light transmission path.

2. Description of the Related Art

It has hitherto been known that stimulated Brillouin scattering (SBS) light is generated when a semiconductor laser diode (LD) of a light transmitting apparatus transmits an optical signal having a small emission spectral width to a light transmission path. When the stimulated Brillouin scattering light is generated, incident light turns out to be stokes light and travels back to the light transmitting side due to a conversion of the light propagated in the reverse direction. Optical output electric power transmitted in the form of the stokes light propagated in the reverse direction is reduced, and a quality of data transmission thereof declines. As a result, a data error rate rises, and there arises inconveniences such as a disconnection of the line.

The stimulated Brillouin scattering light occurs when over a certain value of optical output electric power (when over a threshold value). The threshold value at which the stimulated Brillouin scattering light occurs becomes in this case higher with a larger emission spectral width of a light source such as a laser diode of the light transmitting apparatus. Accordingly, for implementing a stable data transmission while avoiding the occurrence of the stimulate Brillouin scattering light, it is effective to set the threshold value high by enlarging the emission spectral width of the light source (such as the LD etc) of the light transmitting apparatus.

The enlargement of the emission spectral width involves adding frequency modulation on the driving current of the laser diode. If a frequency modulation component is overlapped with the driving current of the laser diode, a waveform of a light transmission output to be transmitted is liable to deteriorate. Accordingly, in the case of superposing the frequency modulation component on the driving current of the semiconductor laser diode, it is required that the superposition thereof be set to the minimum.

For restraining down to the minimum the deterioration of the transmission characteristic which is caused by both of the frequency modulation and the stimulated Brillouin scattering light, it is required that a quantity with which to enlarge the emission spectral width of the light source such as the laser diode be adjusted (set) to a proper value corresponding to a light intensity of the stokes light while observing the stokes light produced due to the stimulated Brillouin scattering light.

What is known as this type of prior art light transmitting apparatus is disclosed in Japanese Patent Laid-Open Publication Nos. Hei 7-28107 and Hei 8-6078.

FIG. 1 is a block diagram showing a construction of an optical amplifier in the prior art.

This optical amplifier is constructed to detect noise light propagated in the direction opposite to that of an optical signal. The detection of the noise light involves observing amplified spontaneous emission (ASE) generated and outputted by a pumping light source. An optical circulator is disposed between two rare-earth doped fibers in order to detect the amplified spontaneous emission (ASE). A photo detector detects the amplified spontaneous emission from the optical circulator.

FIG. 2 is a block diagram illustrating another construction of the optical amplifier in the prior art.

An external modulation light transmitting apparatus in this prior art involves the use of an optical splitter and an optical combiner in order to detect an optical beat signal (optical interference) between transmission signal light and backward scattered light (stokes light) due to stimulated Brillouin scattering light. The detected optical beat signal is fed back to a driving circuit of a phase modulator, thereby effecting phase modulation on the signal light from the semiconductor laser diode. With this phase modulation effected, an emission spectral width of the semiconductor laser diode is controlled.

In the former prior art, the optical circulator disposed between the rare-earth doped fibers detects the amplified spontaneous emission. In this case, the stokes light generated due to the stimulated Brillouin scattering on the light transmission path is absorbed by the rare-earth doped fibers. Hence, there arises such a defect that the stokes light can not be detected through the optical circulator.

In the latter prior art, the optical splitter and the optical combiner are needed for detecting the optical beat signal between the stimulated Brillouin scattering light and the optical signal. Consequently, the number of the optical circuit parts increases, resulting in a defect of causing scale-ups of the apparatus and of signal processing.

SUMMARY OF THE INVENTION

It is a primary object of the present invention, which was contrived to obviate the problems inherent in the prior art systems described above, to provide a light transmitting apparatus capable of enhancing a quality of data transmission with a simple construction by surely suppressing backward scattered light (stokes light) produced due to stimulated Brillouin scattering.

According to one aspect of the present invention, a light transmitting apparatus incorporating an emission spectrum control function comprises a light emitting element for transmitting signal light optically modulated by a driving signal corresponding to a transmission signal, an optical circulator connected to the light emitting element, and a photo detector for receiving backward scattered light and outputting a detection signal corresponding to a light intensity. The optical circulator transmits signal light from the light emitting element to the light transmission path, receives backward scattered light generated on the light transmission path and outputs the backward scattered light to a side different from the one to which the light emitting element is connected.

The light transmitting apparatus according to the present invention further comprises an emission spectrum negative feedback control unit for modulating a driving signal so as to change an emission spectral width of the light emitting element, corresponding to the detection signal.

The negative feedback control unit enlarges the emission spectral width when the light intensity of the backward scattered light is larger than a predetermined value. An emission spectral width control circuit enlarges the emission spectral width by increasing a degree of modulation of a driving signal.

By contrast, the negative feedback control unit, when the light intensity of the backward scattered light is smaller than the predetermined value, narrows the emission spectral width. In this case, the emission spectral width control circuit decreases the modulation index of the driving signal.

The negative feedback control unit includes a driving circuit for converting a transmission signal to be inputted into a driving signal and outputting this signal, and a frequency modulation circuit for adding frequency modulation on the driving current so that the emission spectral width changes corresponding to a level of the detection signal, and outputting it to the light emitting element.

The backward scattered light contains stimulated Brillouin scattering light.

According to another aspect of the present invention, a light transmitting apparatus comprises a driving circuit for supplying a DC driving current, a semiconductor laser diode, supplied with the driving current, for outputting consecutive beams of light, an external optical modulator for effecting external optical modulation on the consecutive beams of light on the basis of a transmission signal and outputting signal light, an optical circulator connected to the external optical modulator, and a photo detector for receiving the backward scattered light outputted from the optical circulator and outputting the detection signal corresponding to the light intensity. The optical circulator transmits the signal light to the light transmission path, receives the backward scattered light generated on the light transmission path and outputs the backward scattered light to a side different from the one to which the external optical modulator is connected.

The light transmitting apparatus further comprises a negative feedback control unit for modulating the driving current so that the emission spectral width of the light emitting element changes corresponding to the detection signal.

The negative feedback control unit includes an emission spectral width control circuit for controlling the emission spectral width by adding frequency modulation on the driving current, corresponding to a level of the detection signal. The emission spectral width control circuit increases a degree of modulation of the driving current when a light intensity of the backward scattered light is larger than a predetermined value, and decreases the degree of modulation of the driving current when the light intensity of the backward scattered light is smaller than the predetermined value. The external optical modulator includes an intensity modulating unit for modulating an intensity of the consecutive beams of light on the basis of the transmission signal.

In the light transmitting apparatus of the present invention, the backward scattered light (the stokes light) due to the stimulated Brillouin scattering which occurs on the light transmission path is led to the light receiving element via the circulator. The modulation is effected on the driving current so that the emission spectral width of the light emitting element changes corresponding to the level of the detection signal into which the backward scattered light is photoelectrically converted. When the level of the detection signal rises, a threshold value at which the stimulated Brillouin scattering occurs is set high, and the driving current is supplied with a modulation signal to suppress the backward scattered light. With this negative feedback control performed, the stimulated Brillouin scattered light can be suppressed down a fixed quantity or under.

Accordingly, there is no necessity for using an optical splitter and an optical combiner for detecting an optical beat signal between the stimulated Brillouin scattering light and the optical signal as used in the prior art. Hence, the backward scattered light generated due to the stimulated Brillouin scattering can be surely suppressed with a simple construction without increasing the number of optical circuit parts, i.e., without any scale-ups of the apparatus and of the signal processing. As a result, a data error rate decreases, and a quality of the data transmission is enhanced without causing inconveniences such as a disconnection of a line, and long-distance optical communications can be conducted.

According to still another aspect of the present invention, the light transmitting apparatus comprises an external modulating unit for effecting intermittent optical modulation on the emission on the basis of transmission data.

In contrast with the construction using the direction modulation described above, according to an external modulation system, the high-speed modulation can be done. In this case, chirping of the laser diode is small, and hence the backward scattered light due to the stimulated Brillouin scattering is liable to largely occur. However, the backward scattered light exhibiting a comparatively high level, which is produced due to the stimulated Brillouin scattering, can be surely suppressed by the external modulation. As a result, the data error rate according to the external modulation system decreases, and the quality of the data transmission is enhanced without causing inconveniences such as the disconnection of the line. Then, the long-distance optical communications can be carried out. The external modulation system can be adopted together with the direct modulation system, and a degree of freedom in terms of designing the light transmitting apparatus is also increased.

BRIEF DESCRIPTION OF THE DRAWINGS

The above and other objects, features and advantages of the present invention will become more apparent from the following detailed description when taken in conjunction with the accompanying drawings wherein.

DETAILED DESCRIPTION OF THE PREFERRED EMBODIMENTS

To start with, before explaining a light transmitting apparatus according to the present invention, a prior art light transmitting apparatus will be described for facilitating the understanding of the present invention.

Figure 1:
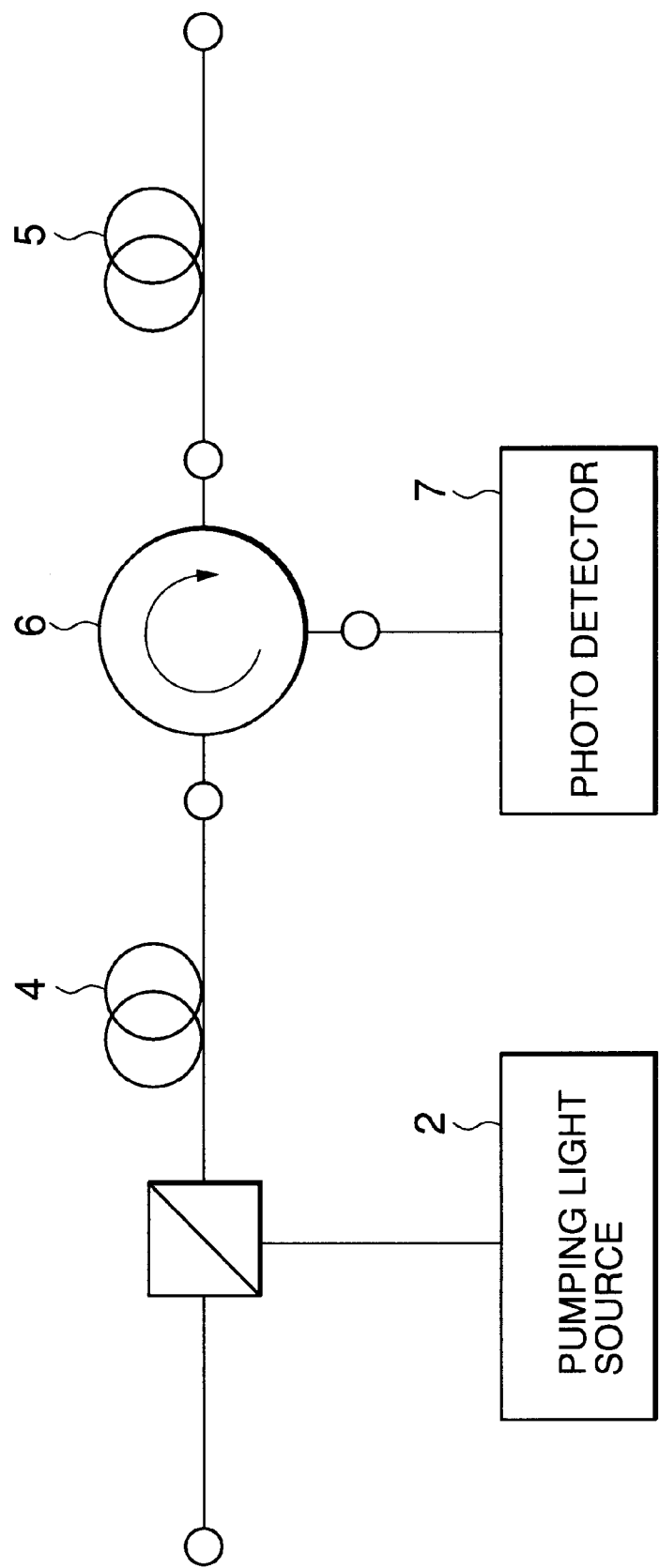
FIG. 1 is a block diagram showing an example of construction of an optical amplifier in the prior art.

FIG. 1 is a block diagram showing one example of a construction of a prior art optical amplifier. The optical amplifier detects noise light propagated in a direction opposite to that of an optical signal. Amplified spontaneous emission (ASE) light generated and outputted by a pumping light source 2 is observed in order to detect the noise light. For detecting amplified spontaneous emission (ASE) light, an optical circulator 6 is provided between two rare-earth doped fibers 4, 5, and a photo detector 7 detects the amplified spontaneous emission light from this optical circulator 6.

Figure 2:
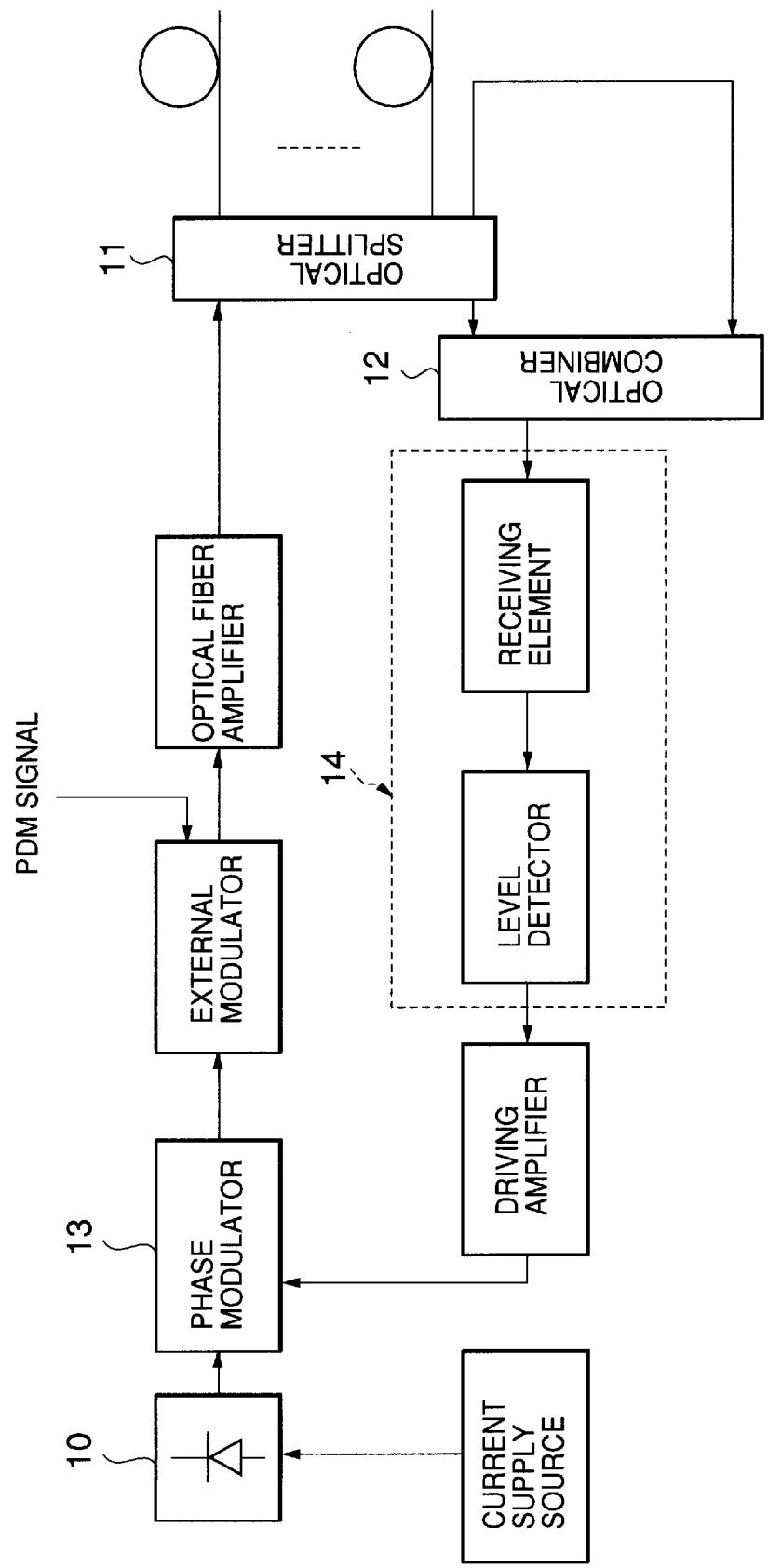
FIG. 2 is a block diagram showing another example of construction of the optical amplifier in the prior art.

FIG. 2 is a block diagram illustrating another construction of the prior art optical amplifier.

An external modulation light transmitting apparatus in this prior art detects an optical beat signal (light interference) between transmission signal light and backward scattered light (stokes light) due to stimulated Brillouin scattering light by use of an optical splitter 11 and an optical combiner 12. The detected optical beat signal is fed back to a driving circuit 14 of a phase modulator 13, and the signal light from laser 10 is subjected to a phase modulation, thereby controlling an emission spectral width thereof.

In the former construction, the amplified spontaneous emission (ASE) light is detected by the optical circulator 6 provided between the rare-earth doped fibers 4 and 5, in this case, the rare-earth doped fibers 4, 5 absorb the stokes light generated by the stimulated Brillouin scattering on the light transmission path. Accordingly, it has such a defect that the stokes light cannot be detected through the optical circulator 6.

The former construction requires the optical splitter 11 and the optical combiner 12 which serve to detect the optical beat signal between the stimulated Brillouin scattering light and the optical signal, and has such a defect that the number of the optical circuit parts rises, resulting in increases both in a size of the apparatus and in a scale of the signal processing.

Next, an embodiment of the light transmitting apparatus according to the present invention will be described in greater detail with reference to the drawings.

Figure 3:
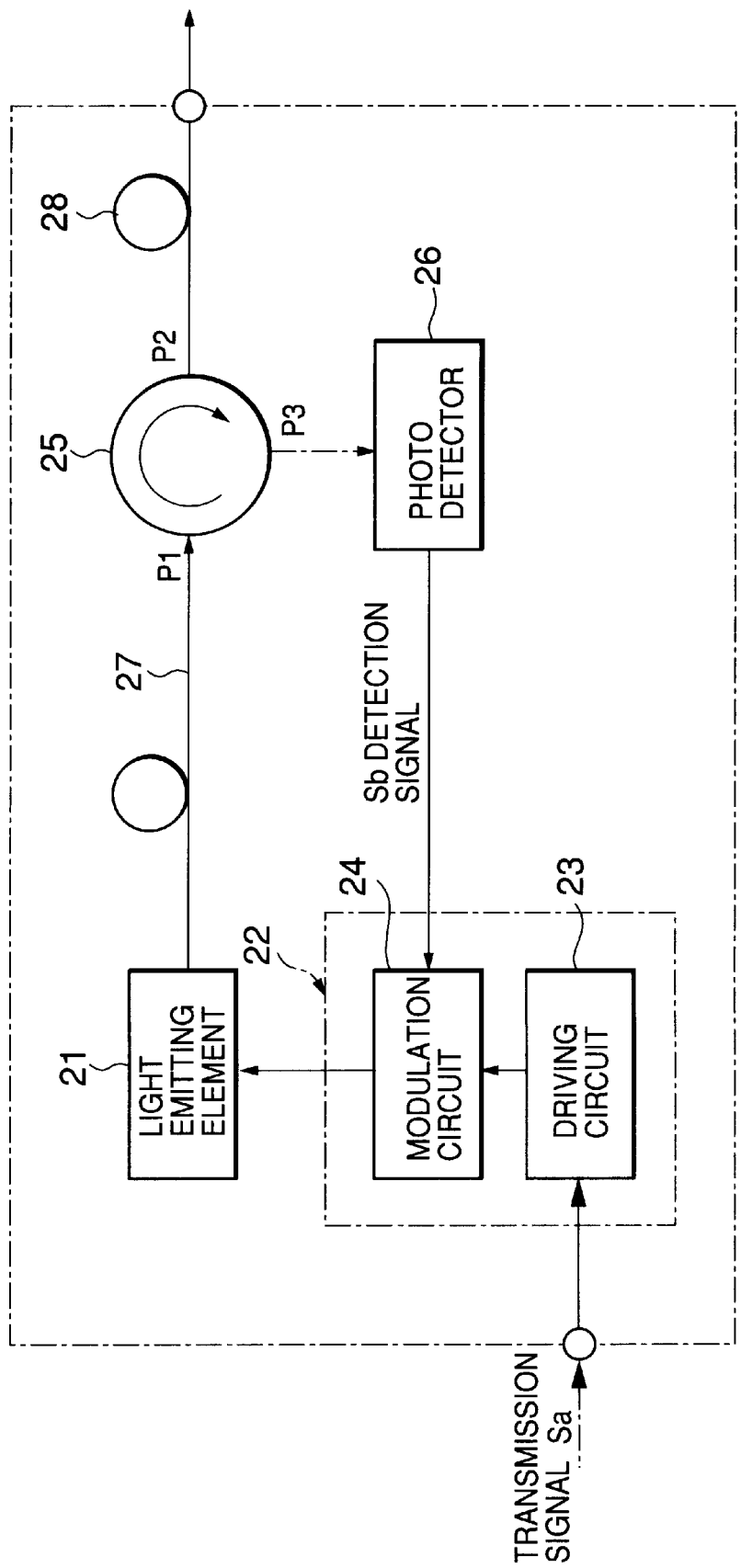
FIG. 3 is a block diagram showing a construction of a light transmitting apparatus in a first embodiment of the present invention.

FIG. 3 is a block diagram showing a construction in a first embodiment of the light transmitting apparatus of the present invention.

The light transmitting apparatus in the first embodiment includes a light emitting element 21 for transmitting, to a light transmission path, signal light optically modulated by a transmission signal Sa to be inputted, a photo detector 26 for detecting a light intensity of the backward scattered light (stokes light) due to the stimulated Brillouin scattering (SBS) from the light transmission path, and a control circuit 22 for executing negative feedback control for changing an emission spectral width of the light emitting element 21 in accordance with a detection level. The control circuit 22 includes a driving circuit 23 for amplifying and converting the transmission signal Sa to be inputted into a drive signal.

The light transmitting apparatus according to the present invention further includes an optical circulator 25, a photo detector 26 for outputting a detection signal assuming a level corresponding to the light intensity of the stokes light from a port P3 of the optical circulator 25, an optical fiber 27 through which to transmit an optical signal (an optical modulation signal) outputted by the light emitting element 21, and an optical fiber 28 through which to transmit the optical signal outputted from the optical circulator 25 to an unillustrated external light transmitting apparatus. The optical circulator 25 has a port P1 to which the signal light is inputted from the light emitting element 21, a port P2 from which the signal light is outputted, and a port P3 from which to output the stokes light inputted to the port P2.

The control circuit 22 includes the driving circuit 23 for amplifying and converting the transmission signal Sa to be inputted into the drive signal, and outputting the drive signal, and a modulation circuit 24 for effecting modulation to change the emission spectral width of the light emitting element 21 so that the drive signal from the driving circuit 23 corresponds to a level of a detection signal Sb from the photo detector 26, and outputting the signal to the light emitting element 21.

Next, an operation of the light transmitting apparatus in the first embodiment will be explained.

The driving circuit 23 of the control circuit 22 amplifies and converts the transmission signal Sa to be inputted to this circuit 23 into a drive signal, and outputs this drive signal to the modulation circuit 24. The modulation circuit 24 effects the modulation to change the emission spectral width of the light emitting element 21 and outputs the modulated signal to the light emitting element 21. The light emitting element 21 performs optical modulation based on a modulation signal from the modulation circuit 24 of the control circuit 22, and transmits this optical signal to the optical fiber 27. The optical signal from the optical fiber 27 is inputted to the port P1 of the optical circulator 25 and outputted to the unillustrated external light transmitting apparatus via the optical fiber 28 from the port P2.

The stokes light produced by the stimulated Brillouin scattering on the light transmission path containing the optical fiber 28 is incident upon the photo detector 26 via the port P3 from the port P2 of the optical circulator 25. The photo detector 26 converts the optical signal (stokes light) from the port P3 of the optical circulator 25 into a detection signal Sb assuming a level corresponding to the light intensity of this optical signal, and outputs the detection signal Sb to the modulation circuit 24 of the control circuit 22.

The modulation circuit 24 adds the modulation on a driving current to the light emitting element 21 so that the emission spectral width of the light emitting element 21 changes corresponding to the level of the detection signal from the photo detector 26. In this case, when the level of the detection signal from the photo detector 26 increases, i.e., when the stokes light due to the stimulated Brillouin scattering is large on the light transmission path, the modulation circuit 24 adds the modulation on the driving current to the light emitting element 21 so as to enlarge the emission spectral width of the light emitting element 21.

Thus, in accordance with the first embodiment, there is executed the negative feedback control (closed loop control) for modulating the drive current so that the emission spectral width of the light emitting element 21 changes corresponding to the level of the detection signal of the stokes light. When the detection signal level increases with the negative feedback control done, a threshold value at which the stimulated Brillouin scattering occurs is set higher, and the stokes light thereof is suppressed. Accordingly, without reducing the optical output electric power to be transmitted, a quality of the data transmission is enhanced, and long-distance optical communications can be carried out.

Next, a second embodiment of the light transmitting apparatus of the present invention will be discussed.

Figure 4:
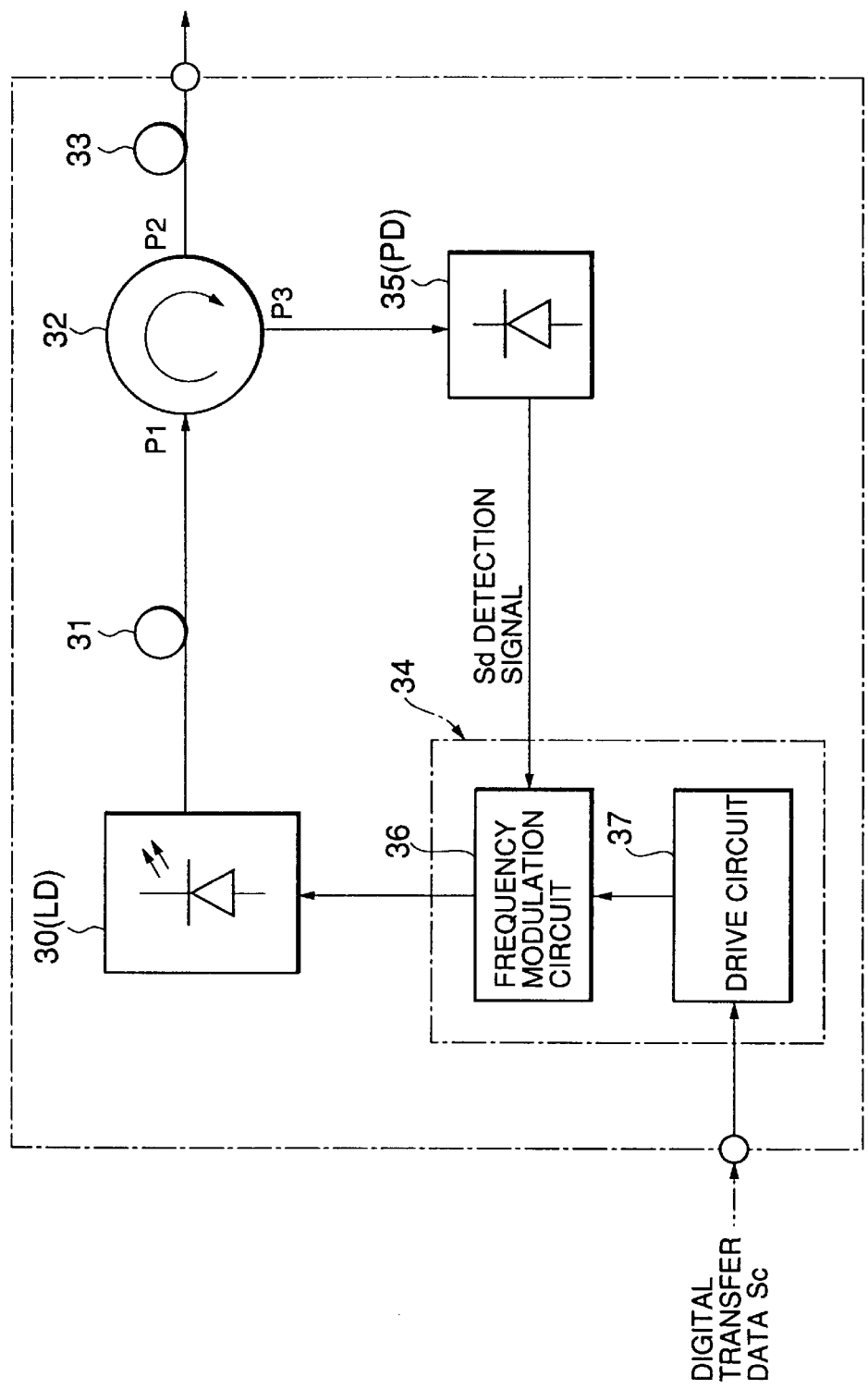
FIG. 4 is a block diagram showing a construction of the light transmitting apparatus in a second embodiment of the present invention.

FIG. 4 is a block diagram showing a construction of the light transmitting apparatus in the second embodiment of the present invention.

The light transmitting apparatus in the second embodiment includes a semiconductor laser diode (LD) 30 for transmitting the optical signal optically modulated by the transmission signal to be inputted, and a control circuit 34 for adding, on the driving signal according to a code of digital transmission data Sc to be inputted, the modulation for changing the emission spectral width of the semiconductor laser diode 30 corresponding to a detection level of the backward scattered light (stokes light) due to the stimulated Brillouin scattering (SBS), and outputting the signal to the semiconductor laser diode 30.

The light transmitting apparatus also includes an optical fiber 31 for transmitting the optical signal from the semiconductor laser diode 30, and an optical circulator 32 having a port P1 to which the optical signal is inputted from the optical fiber 31, a port P2 from which this optical signal is outputted, and a port P3 from which the stokes light inputted to the port P2 is outputted.

The light transmitting apparatus in the second embodiment further includes an optical fiber 33 for transmitting the optical signal from the port P2 of the optical circulator 32, and a photo diode (PD) 35 for photoelectrically converting the stokes light from the port P3 of the optical circulator 32, and outputting a detection signal Sd assuming a level corresponding to a light intensity of this stokes light.

The control circuit 34 includes a driving circuit 37 for outputting the driving current (signal) amplified based on the code of the digital transmission data Sc to be inputted, and a frequency modulation circuit 36 for adding, on the driving current from this driving circuit 37, frequency modulation to change an emission spectral width of the laser diode 30, and outputting the signal to the laser diode 30.

Next, an operation of the light transmitting apparatus in the second embodiment will be described.

The second embodiment deals with a direct modulating system for effecting optical modulation of the laser diode 30 with the driving signal according to the code of the digital transmission data Sc to be inputted.

To begin with, a driving circuit 37 of the control circuit 34 amplifies and converts the digital transmission data signal Sc to be inputted to this circuit 37 into a driving signal corresponding to the code of the digital transmission data signal Sc. Further, the driving circuit 37 executes the modulation to change the emission spectral width of the laser diode 30 and outputs the signal to the frequency modulation circuit 36.

The semiconductor laser diode 30 performs the optical modulation based on the driving signal from the frequency modulation circuit 36 of the control circuit 34, and transmits the signal to the optical fiber 31. The signal light from the optical fiber 31 is inputted to the port P1 of the optical circulator 32, and outputted to the unillustrated external light transmitting apparatus via the optical fiber 33 from the port P2.

The stokes light produced due to the stimulated Brillouin scattering on the light transmission path containing the optical fiber 33 is inputted to the photo diode 35 via the port P3 from the port P2 of the optical circulator 32. The photo diode 35 converts the stokes light from the port P3 of the optical circulator 32 into a detection signal Sd assuming a level corresponding to this light intensity, and outputs this signal to the frequency modulation circuit 36 of the control circuit 34.

The frequency modulation circuit 36 adds the frequency modulation on the driving current from the driving circuit 37 so as to correspond to the level of the detection signal Sd from the photo diode 35, and transmits it to the semiconductor laser diode 30. The emission spectral width herein is increased by adding the frequency modulation. In this case, the emission spectral width becomes larger as a degree of the modulation increases. Accordingly, the degree of the modulation becomes deeper every time the level of the detection signal Sd from the photo diode 35 increases, and the emission spectral width of the laser diode 30 is enlarged.

Thus, in accordance with the second embodiment, the detection signal Sd assuming the level corresponding to the light intensity of the stokes light is transmitted from the photo diode 35 to the control circuit 34. With the negative feedback control (closed loop control) implemented, when level of the detection signal Sd becomes larger, the threshold value at which the stimulated Brillouin scattering occurs is set high, thus suppressing the stokes light. Hence, it never happens that the optical output electric power of the optical signal from the semiconductor laser diode 30 decreases. As a result, the quality of the data transmission is enhanced, and the long-distance optical communications can be conducted.

Figure 5:
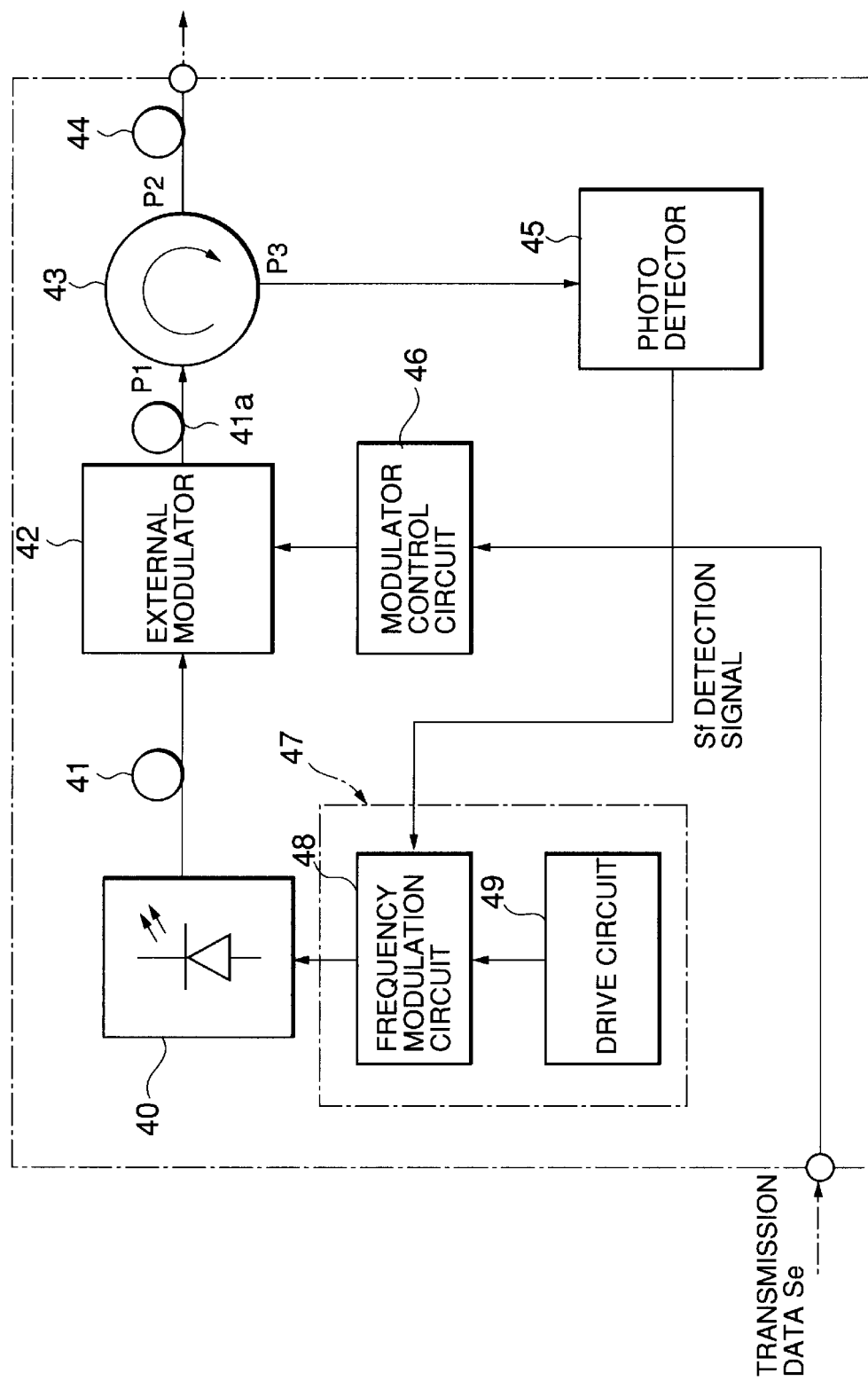
FIG. 5 is a block diagram showing a construction of the light transmitting apparatus in a third embodiment of the present invention.

FIG. 5 is a block diagram illustrating a construction of the light transmitting apparatus in a third embodiment.

The light transmitting apparatus in the third embodiment includes a semiconductor laser diode (LD) 40 for converting a data signal to be inputted into an optical signal and transmitting this optical signal, an optical fiber 41 for transmitting the optical signal from the semiconductor laser diode 40, an external modulator 42 serving as an external modulating device for optically modulating an emission inputted from the optical fiber 41 with a control signal and outputting it, and a modulator control circuit 46. The modulator control circuit 46 controls optically intermittent optical modulation in the external optical modulator 42 by the transmission data Se.

The light transmitting apparatus in the third embodiment further includes an optical fiber 41a for transmitting the optical signal from the external modulator 42, and an optical circulator 43. The optical circulator 43 has a port P1 to which the signal light is inputted from the optical fiber 41a, and a port P2 from which the signal light is outputted. The backward scattered light (the stokes light) is inputted from the light transmission path to the port P2, and outputted from a port P3. The signal light from the port P2 of the optical circulator 43 is transmitted to the unillustrated external light transmitting apparatus via an optical fiber 44.

The light transmitting apparatus in the third embodiment includes the semiconductor laser diode 40, the optical circulator 43, a photo detector 45, the external optical modulator 42 and the modulator control circuit 46. The optical circulator 43 transmits the signal light inputted from the port P1 to the optical fiber 44 from the port P3. On the other hand, the backward scattered light (stokes light) from the light transmission path is inputted from the port P3 of the optical circulator 43 via the optical fiber 44.

The backward scattered light is outputted to the port P3 of the optical circulator 43. The backward scattered light is photoelectrically converted by the photo detector 45, and a detection signal Sf assuming a level corresponding to the light intensity is outputted.

A control circuit 47 adds on the driving signal the modulation to change the emission spectral width of the laser diode 40 so as to correspond to the level of the detection signal Sf from photo detector 45, and outputs it to the laser diode 40. The control circuit 47 has a driving circuit 49 for outputting substantially a DC driving current, and a frequency modulation circuit 48. The frequency modulation circuit 48 adds the frequency modulation on the driving current from the driving circuit 49 so as to correspond to the level of the detection signal Sf from the photo detector 45, and transmits it to the semiconductor laser diode 40. With the frequency modulation, the emission spectral width of the semiconductor laser diode 40 is changed.

Next, an operation of the light transmitting apparatus in the third embodiment will be explained.

In the third embodiment, to start with, the driving circuit 49 of the control circuit 47 transmits substantially the DC driving signal to the frequency modulation circuit 48. Herein, the driving circuit 49 effects the modulation to change the emission spectral width of the semiconductor laser diode 40 so as to correspond to the detection signal Sf assuming the level corresponding to the light intensity of the stokes light, and outputs it to the semiconductor laser diode 40. The semiconductor laser diode 40 changes the emission spectral width so as to correspond to a modulation signal from the frequency modulation circuit 48 of the control circuit 47, and transmits it to the optical fiber 41. The optical signal from the optical fiber 41 is inputted to the external modulator 42.

Inputted from the modulator control circuit 46 to the external modulator 42 is an optical modulation signal (a control signal) corresponding to transmission data Se. The optical signal optically modulated in the external modulator 42 is inputted to the port P1 of the optical circulator 43 via the optical fiber 41a, and outputted to the unillustrated external light transmitting apparatus via the optical fiber 44 as well as via the port P2.

The stokes light produced due to the stimulated Brillouin scattering on the light transmission path containing the optical fiber 44, is incident upon the photo detector 45 via the port P3 from the port P2 of the optical circulator 43. The photo detector 45 converts the stokes light from the port P3 of the optical circulator 43 into the detection signal Sf assuming the level corresponding to an intensity of this optical signal, and outputs the signal to the frequency modulation circuit 48 of the control circuit 47.

The frequency modulation circuit 48 adds the frequency modulation on the driving current from the driving circuit 49, corresponding to the level of the detection signal Sf from the photo detector 45, and transmits it to the semiconductor laser diode 40. The emission spectral width herein is varied. In this case, the emission spectral width becomes larger as the degree of the modulation increases. Accordingly, the degree of the modulation becomes larger every time the level of the detection signal Sf from the photo diode 45 increases. The emission spectral width of the semiconductor laser diode 40 is thereby enlarged.

In the third embodiment, the external modulator 42 is used, and it is therefore feasible to effect the high-speed modulation with respect to the direct modulating system in the second embodiment. Chirping of the semiconductor laser diode 40 is small, however, the stokes light due to the stimulated Brillouin scattering is largely generated.

Accordingly, as in the first and second embodiments, the detection signal Sf corresponding to the light intensity of the stokes light is transmitted from the photo detector 45 to the control circuit 47, and the negative feedback control (closed loop control) thereof is carried out. With this negative feedback control conducted, when the level of the detection signal Sf increases, the threshold value at which the stimulated Brillouin scattering occurs is set high, and the stokes light can be effectively suppressed. In this case, without reducing the optical output electric power to be transmitted, the quality of the data transmission is enhanced, and the long-distance optical communications can be carried out.

As obvious from the discussion given above, according to the light transmitting apparatus of the present invention, the backward scattered light due to the stimulated Brillouin scattering occurring on the optical transmission path is led out through the optical circulator. The modulation is effected on the driving current so that the emission spectral width changes corresponding to the level of the detection signal of the backward scattered light (the stokes light). The light emitting element is supplied with the modulation signal on the occasion that the level of this detection signal increases, and the threshold value at which the stimulated Brillouin scattering occurs is set high, thereby conducting the negative feedback control for suppressing the backward scattered light.

Accordingly, the backward scattered light caused due to the stimulated Brillouin scattering can be surely suppressed with a simple construction without any scale-ups of the apparatus and of the signal processing as well. As a result, a data error rate decreases, the quality of the data transmission is enhanced without causing any inconvenience such as a disconnection of the line, and the long-distance optical communications can be implemented.

The light transmitting apparatus of the present invention includes the external modulating means for effecting the optical modulation for making the emission intermittent on the basis of the transmission data. As compared with the light transmitting apparatus of the direct modulation system, the high-speed modulation can be done in the external modulation system. In addition, although the backward scattered light due to the stimulated Brillouin scattering is liable to largely occur, the backward scattered light taking a comparatively high level, which is produced due to the stimulated Brillouin scattering, can be surely suppressed by the external modulation. As a consequence, the quality of the data transmission in the external modulation system is enhanced, and the long-distance optical communications can be carried out. It is possible to adopt the external modulation system together with the direct modulation system, and a degree of freedom of a design thereof is also enhanced.

While this invention has been described in connection with certain preferred embodiments, it is to be understood that the subject matter encompassed by way of this invention is not to be limited to those specific embodiments. On the contrary, it is intended for the subject matter of the invention to include all alternative, modification and equivalents as can be included within the spirit and scope of the following claims.

What is claimed is:

1. A light transmitting apparatus incorporating an emission spectrum control function, comprising:

a light emitting element for transmitting signal light optically modulated by a driving signal corresponding to a transmission signal;

an optical circulator for transmitting the signal light from said light emitting element to a light transmission path, receiving backward scattered light generated on the light transmission path and outputting the backward scattered light to a side different from the one to which said light emitting element is connected;

optical detecting means for receiving the backward scattered light outputted from said optical circulator and outputting a detection signal corresponding to a light intensity; and emission spectrum negative feedback control means for modulating a driving signal so as to change an emission spectral width of said light emitting element, corresponding to the detection signal.

2. A light transmitting apparatus incorporating an emission spectrum control function according to claim 1, wherein said negative feedback control means includes first emission spectral width control means for enlarging the emission spectral width when the light intensity of the backward scattered light is larger than a predetermined value.

3. A light transmitting apparatus incorporating an emission spectrum control function according to claim 2, wherein said first emission spectral width control means includes a first driving signal control circuit for increasing a degree of modulation of the driving signal.

4. A light transmitting apparatus incorporating an emission spectrum control function according to claim 2, wherein said negative feedback control means further includes second emission spectral width control means for narrowing the emission spectral width when the light intensity of the backward scattered light is smaller than the predetermined value.

5. A light transmitting apparatus incorporating an emission spectrum control function according to claim 3, wherein said first emission spectral width control means includes a second driving signal control circuit for decreasing the degree of modulation of the driving current.

6. A light transmitting apparatus incorporating an emission spectrum control function according to claim 1, wherein said light emitting element comprises a semiconductor laser diode.

7. A light transmitting apparatus incorporating an emission spectrum control function according to claim 1, wherein said photo detecting means comprises a photo diode.

8. A light transmitting apparatus incorporating an emission spectrum control function according to claim 1, wherein said negative feedback control means includes:
   a driving circuit for converting a transmission signal to be inputted into a driving signal and outputting the driving signal; and
   a frequency modulation circuit for adding frequency modulation on the driving current so that the emission spectral width changes corresponding to a level of the detection signal, and outputting it to said light emitting element.

9. A light transmitting apparatus incorporating an emission spectrum control function according to claim 1, wherein the backward scattered light contains stimulated Brillouin scattering light.

10. A light transmitting apparatus incorporating an emission spectrum control function according to claim 5, wherein the backward scattered light contains stimulated Brillouin scattering light.

11. A light transmitting apparatus incorporating an emission spectrum control function, comprising:
    driving means for supplying a DC driving current;
    a semiconductor laser diode, supplied with the driving current, for outputting continuous wave (CW) light beams;
    external optical modulating means for effecting external optical modulation on the continuous wave (CW) light beams on the basis of a transmission signal, and outputting signal light;
    an optical circulator for transmitting the signal light to a light transmission path, receiving backward scattered light generated on the light transmission path and outputting the backward scattered light to a side different from the one to which said external optical modulating means is connected;
    optical detecting means for receiving the backward scattered light outputted from said optical circulator and outputting a detection signal corresponding to a light intensity; and
    emission spectrum negative feedback control means for modulating the driving current so that an emission spectral width of said semiconductor laser diode changes corresponding to the detection signal.

12. A light transmitting apparatus incorporating an emission spectrum control function according to claim 11, wherein said negative feedback control means includes emission spectral width control means for controlling the emission spectral width by adding frequency modulation on the driving current, corresponding to a level of the detection signal.

13. A light transmitting apparatus incorporating an emission spectrum control function according to claim 12, wherein said emission spectral width control means includes:
    a first driving signal control circuit for increasing a degree of modulation of the driving current when a light intensity of the backward scattered light is larger than a predetermined value; and
    a second driving signal control circuit for decreasing the degree of modulation of the driving current when the light intensity of the backward scattered light is smaller than the predetermined value.

14. A light transmitting apparatus incorporating an emission spectral control function according to claim 11, wherein said external optical modulating means includes intensity modulating means for modulating an intensity of the continuous wave (CW) light beams on the basis of the transmission signal.

15. A light transmitting apparatus incorporating an emission spectrum control function, comprising:
    a light emitting element for transmitting signal light optically modulated by a driving signal corresponding to a transmission signal;
    an optical circulator for transmitting the signal light from said light emitting element to a light transmission path, receiving backward scattered light generated on the light transmission path and outputting the backward scattered light to a side different from the one to which said light emitting element is connected;
    an optical detector for receiving the backward scattered light outputted from said optical circulator and outputting a detection signal corresponding to a light intensity; and
    an emission spectrum negative feedback controller for modulating a driving signal so as to change an emission spectral width of said light emitting element, corresponding to the detection signal.

16. A light transmitting apparatus incorporating an emission spectrum control function according to claim 15, wherein said negative feedback controller includes an emission spectral width controller for selectively enlarging and narrowing the emission spectral width when the light intensity of the backward scattered light is larger and smaller, respectively, than a predetermined value.

17. A light transmitting apparatus incorporating an emission spectrum control function, comprising:
    a driving circuit for supplying a DC driving current;
    a semiconductor laser diode, supplied with the driving current, for outputting light beams;
    an external optical modulator for effecting external optical modulation on the light beams on the basis of a transmission signal, and outputting signal light;
    an optical circulator for transmitting the signal light to a light transmission path, receiving backward scattered light generated on the light transmission path and outputting the backward scattered light to a side different from the one to which said external optical modulator is connected;
    an optical detector for receiving the backward scattered light outputted from said optical circulator and outputting a detection signal corresponding to a light intensity; and an emission spectrum negative feedback controller for modulating the driving current so that an emission spectral width of said semiconductor laser diode changes corresponding to the detection signal.

18. A light transmitting apparatus incorporating an emission spectrum control function according to claim 17, wherein said negative feedback controller includes an emission spectral width controller for controlling the emission spectral width by adding frequency modulation on the driving current, corresponding to a level of the detection signal.

19. A light transmitting apparatus incorporating an emission spectrum control function according to claim 18, wherein said emission spectral width controller includes:

a first driving signal control circuit for increasing a degree of modulation of the driving current when a light intensity of the backward scattered light is larger than a predetermined value; and a second driving signal control circuit for decreasing the degree of modulation of the driving current when the light intensity of the backward scattered light is smaller than the predetermined value.

20. A light transmitting apparatus incorporating an emission spectral control function according to claim 17, wherein said external optical modulator includes an intensity modulator for modulating an intensity of the light beams on the basis of the transmission signal.

* * * * *